United States Patent
Gupta

(10) Patent No.: US 7,435,611 B2
(45) Date of Patent: Oct. 14, 2008

(54) LASER GENERATED STRESS WAVES FOR STICTION REPAIR

(75) Inventor: Vijay Gupta, Sherman Oaks, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/511,858

(22) Filed: Aug. 28, 2006

(65) Prior Publication Data

US 2007/0111364 A1     May 17, 2007

Related U.S. Application Data

(63) Continuation of application No. PCT/US2005/007311, filed on Mar. 7, 2005.

(60) Provisional application No. 60/550,804, filed on Mar. 5, 2004.

(51) Int. Cl.
*H01L 21/00*     (2006.01)

(52) U.S. Cl. .............................. 438/48; 438/50; 438/52

(58) Field of Classification Search .............. 438/48–54
See application file for complete search history.

(56) References Cited

U.S. PATENT DOCUMENTS 6,300,756 B2    10/2001    Sturm et al.
6,433,463 B1     8/2002    Lai et al.

OTHER PUBLICATIONS

Fushinobu et al. "Ultrashort-pulse laser heating of silicon to reduce microstructure adhesion" Int. J. Heat Mass Transfer, vol. 39, No. 15, pp. 3181-3186, 1996.*
Zhou et al. "Finite element simulation of the film spallation process induced by the pulsed laser peening", Journal of Applied Physics, vol. 94, No. 5, Sep. 1, 2003, pp. 2968-2975.*

* cited by examiner

*Primary Examiner*—H. Jey Tsai
(74) *Attorney, Agent, or Firm*—John P. O'Banion

(57) ABSTRACT

Methods and apparatus are presented to release stiction between suspended structures and the underlying surface in freestanding MEMS structures. A nanosecond rise time stress wave is launched on the backside of the Si substrate by impinging a short-duration Nd:YAG laser pulse onto a small area. The compressive stress wave propagates through the Si substrate and arrives at the site of several stiction-failed cantilevers on the front Si surface. The compressive stress wave propagates through the cantilevered structures and is reflected into a tensile wave from their free surfaces. The returning tensile wave pries off the interface, releasing the cantilevers.

29 Claims, 10 Drawing Sheets

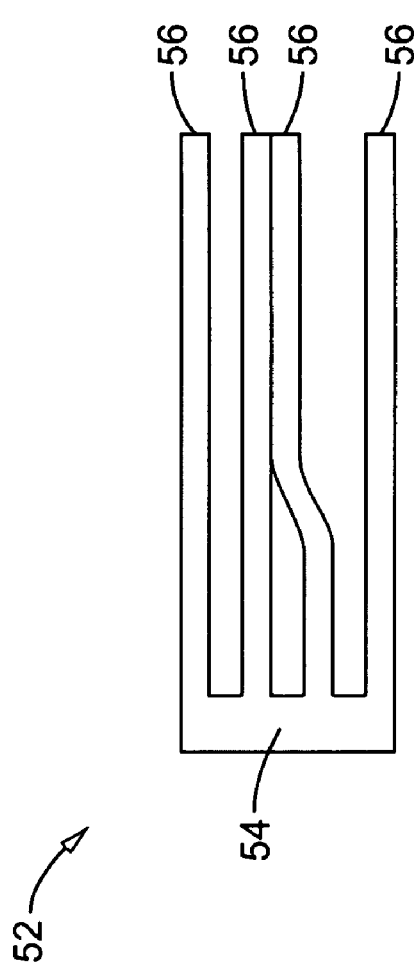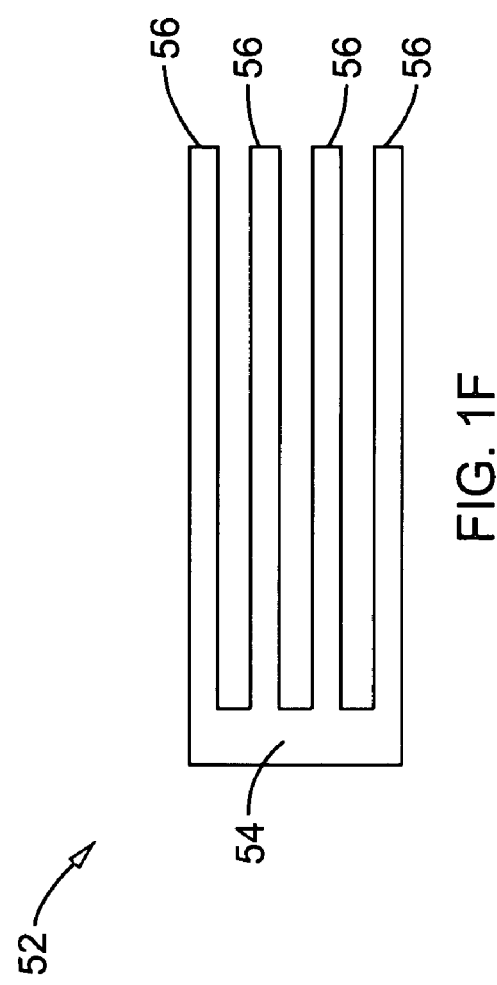

LASER GENERATED STRESS WAVES FOR STICTION REPAIR

CROSS-REFERENCE TO RELATED APPLICATIONS

This application claims priority from, and is a 35 U.S.C. § 111(a) continuation of, co-pending PCT international application serial number PCT/US2005/007311, filed on Mar. 7, 2005, incorporated herein by reference in its entirety, which designates the U.S., which claims priority from U.S. provisional application Ser. No. 60/550,804 filed on Mar. 5, 2004, incorporated herein by reference in its entirety.

STATEMENT REGARDING FEDERALLY SPONSORED RESEARCH OR DEVELOPMENT

This invention was made with Government support under Grant No. DAAD19-00-1-0491 awarded by the Army Research Office and Grant No. ECS0000334 awarded by the National Science Foundation. The Government has certain rights in this invention.

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND OF THE INVENTION

1. Field of the Invention

This invention pertains generally to removing stiction between suspended microstructures and their underlying surfaces, and more particularly to removing stiction in cantilevered structures through laser generated stress waves.

2. Description of Related Art

A well-known problem in the fabrication of MEMS (MicroElectroMechanical Systems) devices from surface micromachining is stiction, which occurs when surface adhesion forces are higher than the mechanical restoring force of the micro-structure. When a device is removed from the aqueous solution after wet etching of an underlying sacrificial layer, the liquid meniscus formed on hydrophilic surfaces pulls the microstructure towards the substrate and stiction occurs. The resulting stiction often leaves the particular microstructure inoperable.

Numerous techniques have been explored to resolve this problem. However, most of these techniques have undesirable trade-offs such as requiring expensive and time-consuming processing, altering the design features, or failing to release all the structures without damage. Techniques such as sublimation and supercritical heating reduce stiction by avoiding the evaporative transition from liquid to vapor that often results in stiction failed structures. Both techniques require time for heating and cooling.

Supercritical heating provides more consistent results but requires a more complicated setup. The use of dimples to reduce the contact surface area, the use of polymer posts to temporarily support the cantilevered structures before being removed by dry etching, and the use of low surface energy self assembled monolayers all add complexity to the design or manufacturing process which limits their use as a universal solution. Using low surface energy rinses such as methanol does not always prevent stiction. Manually removing stiction with probe tips is often risky and is not a batch fabrication process. Clearly there is a need for a quick, simple method for recovering stiction failed devices.

Laser energy has been used to quickly heat up stiction failed structures. Differences in thermal expansion increase the strain energy in beams, which provides the driving force for overcoming the stiction forces. This process requires direct heating of MEMS structures to about 50° C. above the temperature of the substrate. While this relative temperature seems quite low, the absolute temperatures these structures were exposed to were not reported. In any case, directly exposing the MEMS structures to laser energy can cause undesired damage to sensitive structures such as those made out of polymeric and cellular materials in newer types of MEMS devices.

BRIEF SUMMARY OF THE INVENTION

Methods and apparatus are presented to release stiction between suspended structures and the underlying surface in freestanding MEMS structures. A nanosecond rise time stress wave is launched on the backside of the Si substrate by impinging a Nd:YAG laser pulse onto a 3 mm-dia area.

The compressive stress wave propagates through the Si substrate and arrives at the site of several stiction-failed cantilevers on the front Si surface. The compressive stress wave propagates through the cantilevered structures and is reflected into a tensile wave from their free surfaces. The returning tensile wave pries off the interface, releasing the cantilevers. The results presented here show remarkable success in releasing stiction-failed cantilevers in a MEMS device with lengths ranging from approximately 100 µm to approximately 1000 µm. The laser can be focused onto a very large area as long as the total laser energy is proportionally increased to keep the same laser density. Similarly, features with dimensions much less than approximately 100 µm in length (approximately 10 nanometers to approximately 100 µm) and much greater than approximately 1000 µm can be separated.

In a first aspect of the invention, a method for releasing stiction in a suspended microstructure located on a first surface of a substrate is disclosed. The method comprises directing a laser pulse at a second surface of the substrate, and generating a stress wave in the substrate as a result of the laser pulse, wherein the stress wave is directed to propagate from the second surface to the first surface of the substrate to release stiction of the suspended microstructure. The suspended microstructure generally comprises a MEMS cantilevered structure, but may also be a subpart of a complicated device.

In one mode of the current aspect, the first surface comprises a front surface of the substrate and at least a portion of said first cantilevered structure is adhered to the front surface of the substrate.

In one embodiment, a laser pulse is directed at a back surface of the substrate so that the stress wave propagates from the back surface to the front surface of the substrate to separate the adhered portion of the cantilevered structure from the substrate. Typically, a portion of the stress wave is transmitted into the cantilevered structure to generate a tensile stress to separate the cantilevered structure from the substrate.

In another mode of the current aspect, a second cantilevered structure is laterally spaced apart from the first cantilevered structure. In some cases, a portion of the first cantilevered structure is adhered to the second cantilevered structure. The adhered portion of the first cantilevered structure may be separated from the second cantilevered structure as a result of the stress wave.

In other cases where a portion of the second cantilevered surface is adhered to the front surface of the substrate, a laser pulse may be directed at a region of the substrate substantially coincident with the first cantilevered surface to separate the adhered portion of the first cantilevered surface from the substrate. In some embodiments, a reference laser beam may be directed at the front surface of the substrate, wherein the reference laser beam is configured to align the laser pulse with the first cantilevered surface.

Alternatively, a laser pulse may be directed at a region of the substrate sufficient to separate the adhered portions of the both the first cantilevered structure and the second cantilevered structure from the substrate. Generally, the cantilevered structure ranges from approximately 100 μm to approximately 1000 μm in length. However, the methods of the present invention may be applicable to structures substantially less than approximately 100 μm in length (approximately 10 nanometers to approximately 100 μm) and much greater than approximately 100 μm (up to approximately 1-2 mm).

The laser source preferably comprises a ND:YAG laser. In some embodiments, the laser pulse is generally applied to the substrate at a laser fluence ranging from approximately 10 $kJ/m^2$ to approximately 40 $kJ/m^2$. Accordingly, the laser fluence may be adjusted according to the size of the suspended microstructure.

In another aspect of the invention, an apparatus for releasing stiction in a suspended microstructure located on a front surface of a substrate includes a holding fixture for holding the substrate, a laser source directed at a back surface of the substrate, wherein the laser source configured to impinge a laser pulse at a back surface of the substrate to propagate a stress wave from the back surface to the first surface of the substrate to release stiction of the suspended microstructure.

In a preferred mode of the present aspect, the suspended microstructure comprises a cantilevered structure at least a portion of which is adhered to the front surface of the substrate, and wherein the laser source is configured to generate a stress wave to separate the adhered portion of the cantilevered structure from the substrate.

In another mode, the mounting fixture may be positioned with respect to the laser source such that a laser pulse may be focused at a region of the back surface of the substrate substantially coincident with the cantilevered surface to separate the cantilevered surface from the substrate. In one embodiment, the apparatus may further have a reference laser source directed at the front surface of the substrate, wherein the reference laser source configured to align the laser source with the first cantilevered surface.

In yet another mode of the current aspect, the mounting fixture may be positioned with respect to the laser source such that a laser pulse may be focused at a region of the back surface sufficient to separate both the first cantilevered structure and a second cantilevered structure from the substrate.

Preferably, the laser is configured to control the laser fluence applied to the substrate according to the size of the suspended microstructure. In many embodiments, the laser fluence may be adjusted in the range from approximately 10 $kJ/m^2$ to approximately 40 $kJ/m^2$.

In another aspect of the current invention, an apparatus for releasing stiction in a suspended microstructure comprises a means for holding the substrate, and a means for generating a stress wave. The stress wave emanates from a second surface of the substrate and propagates to a first surface of the substrate to release stiction of the suspended microstructure.

Preferably, the means for generating a stress wave comprises a means for directing a laser pulse at a second surface of the substrate, the laser pulse generating a stress wave in the substrate. The apparatus may further comprise an alignment means to align the laser directing means with the first cantilevered surface. Preferably, the alignment means comprises a laser source directed at the front surface of the substrate.

In one embodiment, the apparatus further includes means to control the laser fluence applied to the substrate by the laser pulse. The laser fluence may be varied according to the size of the suspended microstructure.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWINGS

The invention will be more fully understood by reference to the following drawings which are for illustrative purposes only:

FIGS. 1E-1F illustrate the method of the present invention applied to separate lateral stiction between two cantilevered beams.

DETAILED DESCRIPTION OF THE INVENTION

Referring more specifically to the drawings, for illustrative purposes the present invention is embodied in the apparatus generally shown in FIG. 1C through FIG. 9. It will be appreciated that the apparatus may vary as to configuration and as to details of the parts, and that the method may vary as to the specific steps and sequence, without departing from the basic concepts as disclosed herein.

Figure 1A:
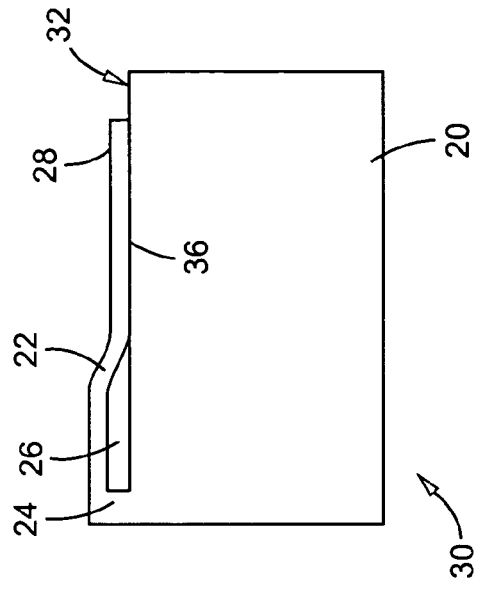
FIGS. 1A-1B illustrate the development of a stiction-failed cantilever as a result of the wet-etching process.
Figure 1B:
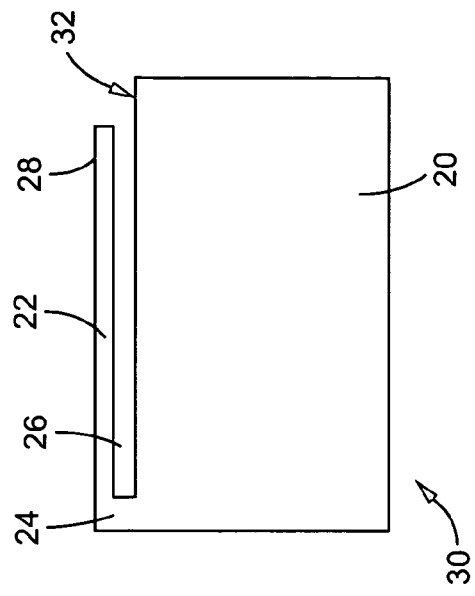

FIGS. 1A and 1B illustrate the stiction phenomena after the wet etching process in MEMS fabrication. The wet chemical etchants are used to remove a sacrificial layer of material to create a suspended or cantilevered structure 22 over the front surface 32 of the substrate 20. A section of the sacrificial layer 24 is left intact such that gap 26 is formed between the cantilevered structure 22 and the substrate 20. As seen in FIG. 1A, the process often leaves rinse solution 34 trapped in the gap 26. During drying, capillary forces are set up which pull the free end 28 of the cantilever 22 down to the substrate 20, as seen in FIG. 1B. Other forces maintain the stiction effect between the cantilever 22 and the substrate after the liquid 34 has evaporated. The resulting effect of the stiction is that a bi-layer is formed at the cantilever/substrate interface 36.

Figure 1C:
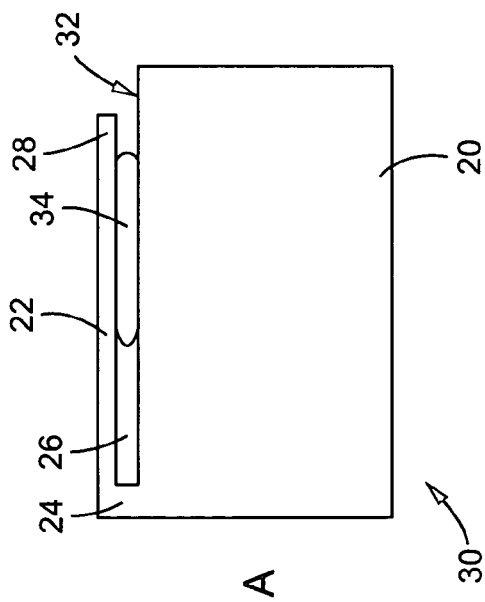
FIGS. 1C-1D illustrate the method of the present invention applied to separate a cantilevered beam from a substrate.
Figure 1D:
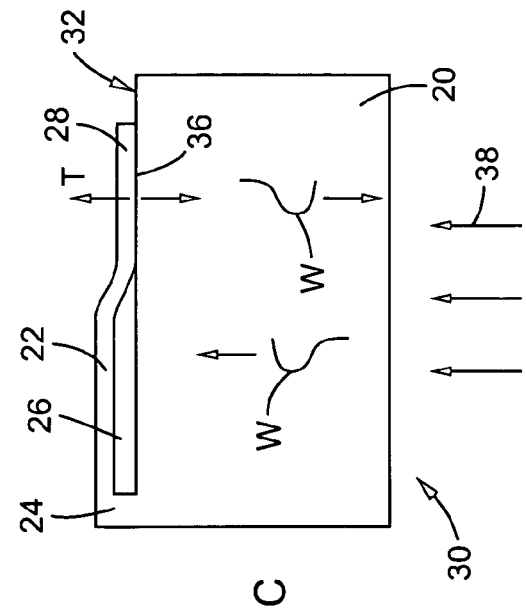

Referring now to FIG. 1C and in accordance with the method of the present invention, a laser pulse 38 is directed at the back surface 30 of the substrate 20. The laser pulse 38 preferably comprises a Nd:YAG laser pulse. However, a number of different lasers may be used as available in the art. Absorption of the laser pulse by the back surface 30 of the substrate 20 generates a compressive pulse or stress wave W directed towards the cantilever 22 and the front surface 32 of the substrate As illustrated in FIG. 1C, the compressive stress pulse W propagating through the substrate 30 is incident upon the substrate/cantilever interface 36. A part of the compressive pulse W is transmitted into the cantilever 22 as the compression pulse strikes the interface 36. The compressive pulse reaches the free surface of the cantilever where it is reflected, thereby forming a tension pulse T. As shown in FIG. 1D, the formation of the tension pulse T leads to the separation of the cantilever 22 from the substrate 20, given a sufficiently high amplitude.

Referring to FIGS. 1E and 1F, the method of the present invention may also be used to repair lateral stiction between suspended microstructures. As shown in FIG. 1E, stiction may occur between two cantilevered beams 56 suspended via base 54 in array 52. A laser pulse may be impinged on the back surface of the substrate as shown in FIG. 1C to generate a stress wave to separate the microstructures 56 from each other as shown in FIG. 1F.

Alternatively, an Al laser-energy absorbing film (not shown) may be sandwiched between the back surface 30 of the substrate and a waterglass layer to vary the characteristics and amplitude of the stress wave as described in U.S. Pat. No. 5,348,402, herein incorporated by reference in its entirety.

Figure 2B:
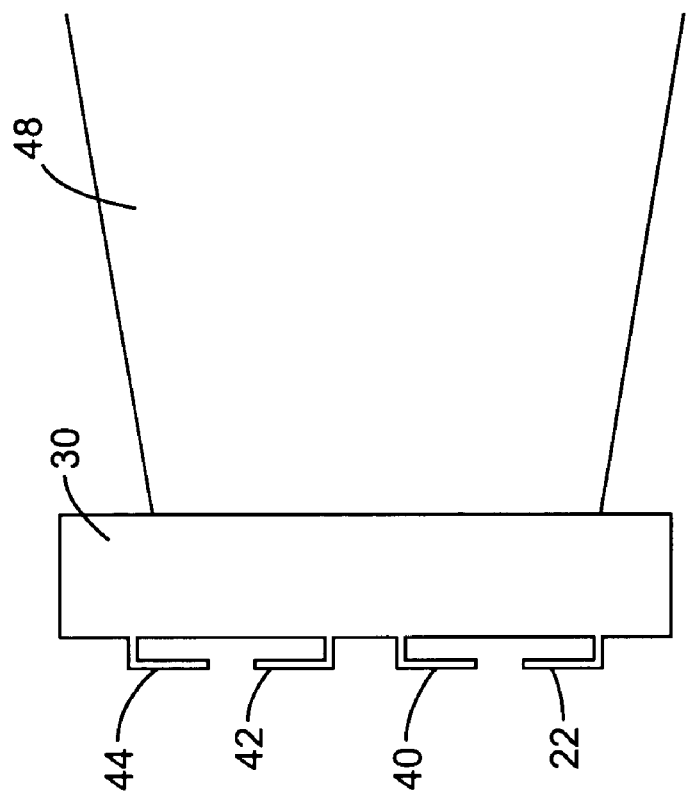
FIG. 2B illustrates a laser beam focused on the back of a substrate to remove stiction in a plurality of cantilevered microstructures in accordance with the present invention.
Figure 2A:
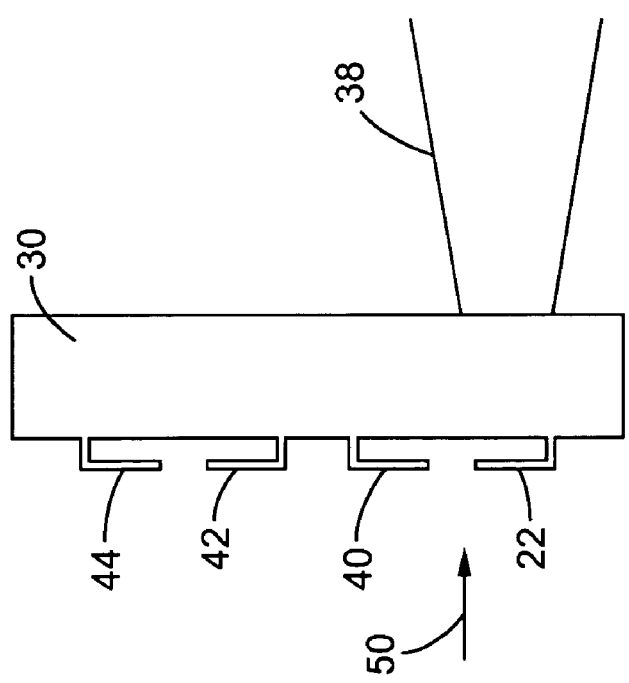
FIG. 2A illustrates a laser beam focused on the back of a substrate coincident with a target cantilever microstructure in accordance with the present invention.

As shown in FIG. 2A, the laser pulse 38 may be generated with a focused beam directed to line up substantially coincident with a particular target cantilever 22. A reference laser beam 50, such as a He—Ne interferometric laser beams such as that described in U.S. Pat. No. 5,348,402, incorporated herein by reference in its entirety, may be pre-aligned or otherwise aligned with the axis of laser pulse 38 so that the laser pulse 38 may be positioned with the cantilever of interest. The reference laser 50 may also be used to identify if the cantilever 22 was successfully separated.

Alternatively, the laser pulse may be broadened to form a large beam 48 that covers a wider impingement area, as shown in FIG. 2B. In this configuration, all the suspended MEM structures (22, and 40-44) are subjected to the pulse to separate any collapsed cantilevers. This approach has the benefit of repairing stiction on all cantilevers on the substrate without identification of problem areas.

Figure 3:
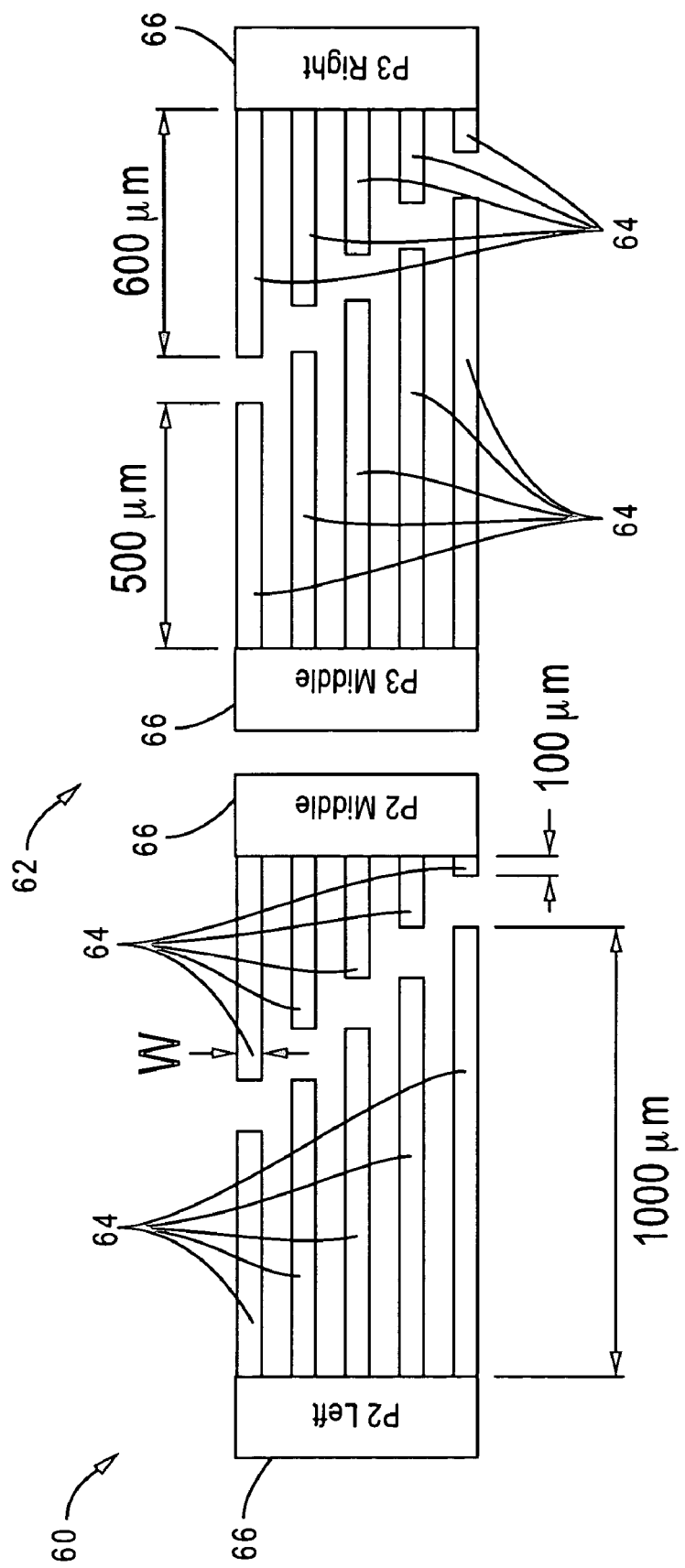
FIG. 3 illustrates special patterns of the two arrays of cantilevers used for testing the method of the present invention.

Referring now to FIGS. 3-10, sample structures manufactured with Sandia National Lab's SUMMiT IV process were tested. As shown in FIG. 3, the structures consisted of two MEMS arrays, 60 and 62, having cantilevered beams 64 made from polysilicon. The cantilevered beams 64 ranged in length from approximately 100 μm to approximately 1000 μm in approximately 100 μm increments, each with a width W of approximately 20 μm. Base regions 66 define areas where the cantilevered beams 64 are attached to the substrate.

Figure 4:
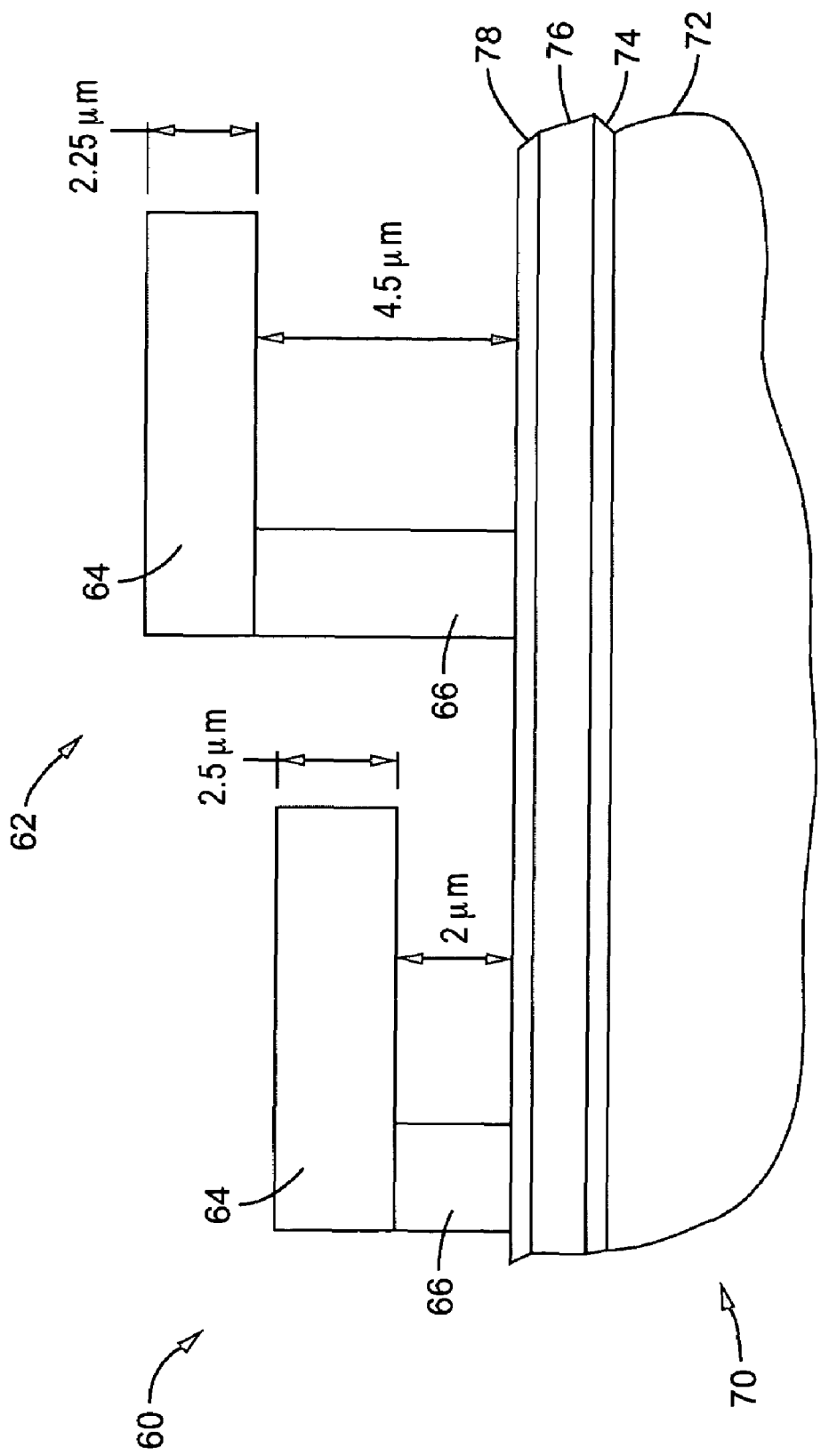
FIG. 4 illustrates dimensions of cantilevered beams and the underlying films of the substrate.
Figure 5:
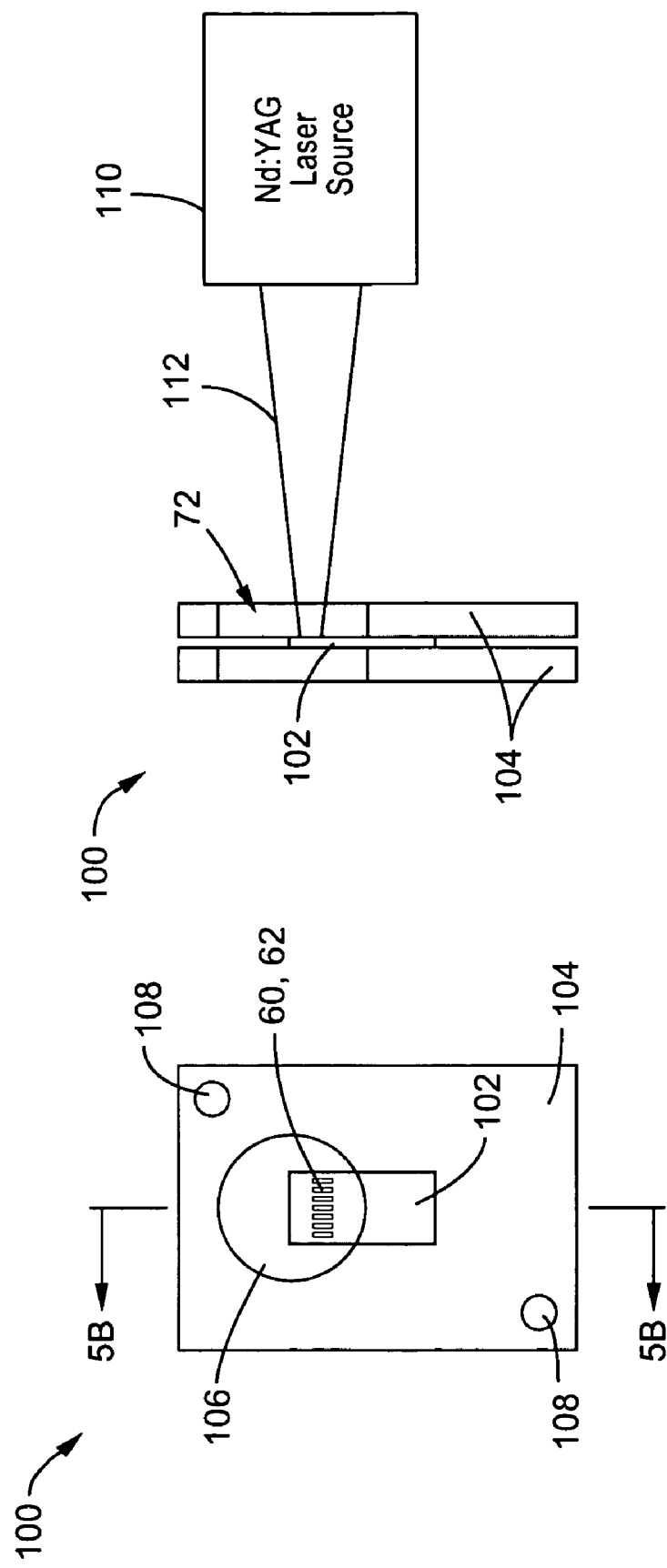
FIGS. 5A and 5B illustrate the holding fixture and setup for applying a laser pulse to the substrate in accordance with the present invention.

As shown in FIG. 4, the cantilevers in the first array 60 were nominally 2.5 μm thick, and suspended by a 2 μm gap $G_1$ via base 66. The second array consisted of beams with 2.25 μm nominal thickness and with a 4.5 μm gap $G_2$. The cantilevers were suspended over substrate 70 which comprises a plurality of layers including 500 μm Si bottom layer 72, 0.63 μm $SiO_2$ layer 74, 0.8 μm SiN layer 76, and a 0.3 μm top layer 78 of polysilicon.

The structures were released in HF according to the SUMMiT release process, except no stiction removal or evaporation steps were performed after the final isopropyl alcohol rinse. The chip was stored to allow air evaporation. The cantilevered beams were then observed under an optical microscope. By comparing the focal depth on the top of the cantilevered beam with that of the substrate below, the stiction failed beams were differentiated from the non-failed beams.

Referring now to FIGS. 5A and 5B, the arrays 60, 62 were positioned on a 2.8 mm×6.3 mm chip 102, which was placed in holding fixture 100. The holding fixture 100 comprises two transparent plastic holding plates 104 having concentric windows 106 at the top section of the plates 104. The chip 102 was sandwiched between the plates 104 and secured with fasteners to position the chip 102 such that the test arrays 60,62 showed through the windows 106, as shown in FIG. 5A.

Referring to FIG. 5B, the mounted sample was placed onto a x-y-z stage (not shown) such that the bare Si substrate surface 72 that was free of any MEMS features faced a Nd:YAG laser source 110. A YAG laser beam 112 was then focused onto a 3 mm-diameter area A (shown in FIG. 6). The duration of the Nd:YAG laser pulse is generally 3-5 ns, but may be extended to longer periods if necessary. Generally, no more than a couple of seconds should be required. The compressive wave propagates through the substrate and film and arrives at the free surface where it is reflected into a tensile wave. Unlike basic laser spallation procedures where an Al laser-energy absorbing film and a sandwiching waterglass layer were used, here, neither one of these layers was necessary as sufficient stress wave amplitudes to release the cantilevers could be generated by directly impinging the laser pulse 112 onto the bare Si surface 72.

Figure 6:
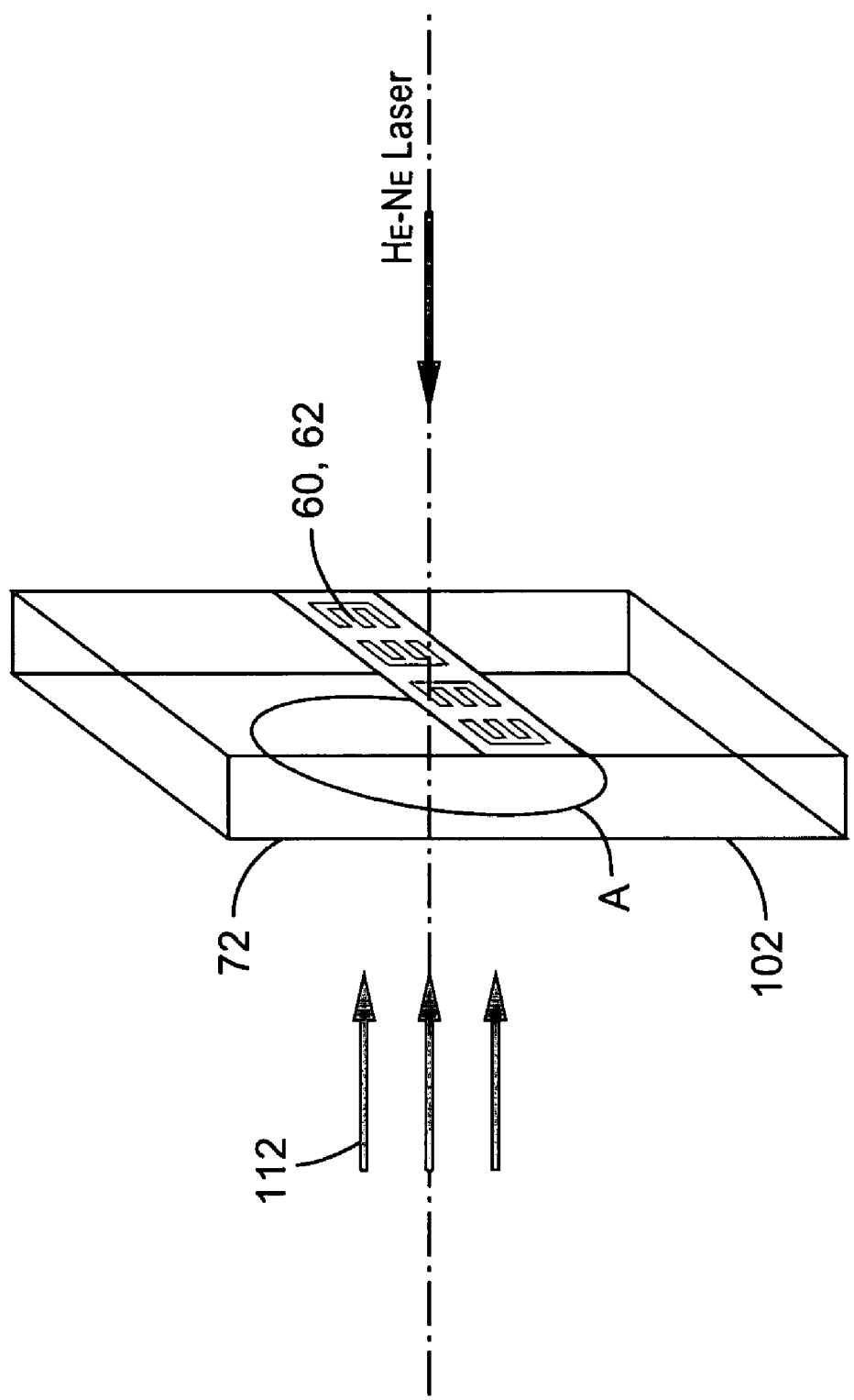
FIG. 6 is a perspective view of the setup of FIGS. 5A and 5B.
Figure 7:
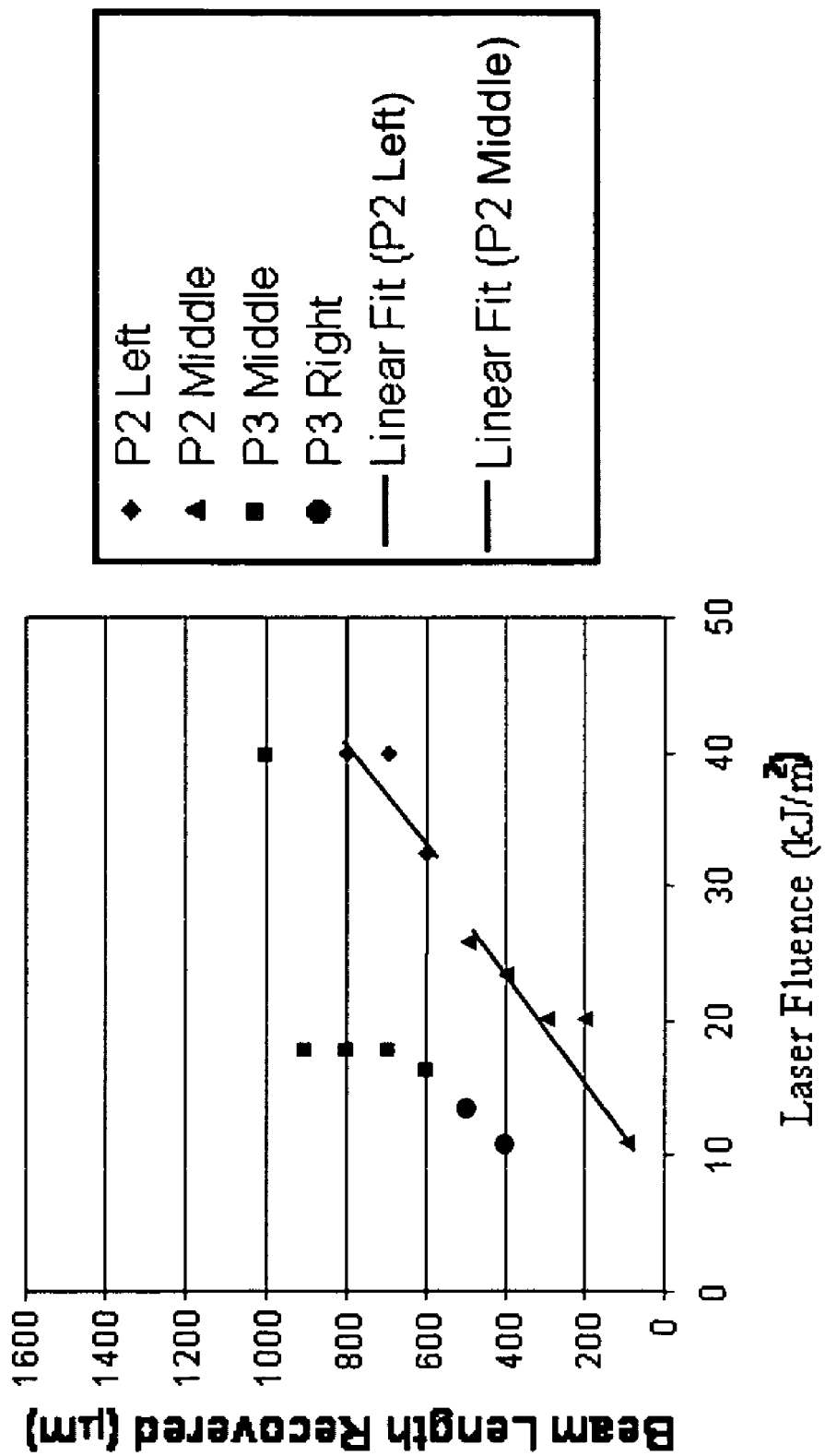
FIG. 7 illustrates a plot showing the variation in the required laser fluence to release stiction-failed cantilevers of a given length.

As shown in FIG. 6, to properly align the cantilevers in the path of laser-generated stress waves, a He—Ne laser, which was pre-aligned with the axis of the YAG laser beam 112, was used. The area A of Nd:YAG laser beam 112 may also be increased to effect all structures 60,62 simultaneously.

The test procedure included impinging the YAG laser beam 112 onto a 3 mm-diameter area A directly behind the test structures 60,62. The laser beam energy was measured prior to each shot. After each stress wave pulse loading, the test structures were examined under an optical microscope to observe for any release or damage to adjacent structures.

The experiments were started with a laser pulse energy of 52 mJ and increased in increments of 20 to 30 mJ until all cantilevers were fully recovered. Because of the rather low laser fluence, the same spot on the Si wafer could be repeatedly shot by the YAG laser. This is generally not possible to do with typical laser spallation setups because they generally require higher stress pulse amplitudes, which result in blasting away of both the Al and the waterglass layers from the shot area. The details of the stress wave generation mechanism through laser ablation and its measurement through interferometry are more fully described in U.S. Pat. No. 5,438,402, previously incorporated by reference.

The critical laser energy for releasing cantilevers of different lengths is summarized in Table 1. The symbol (*) refers to the second pulse the chip was subjected to at 282 mJ. This second 282 mJ pulse was visually directed at the left P2 base. The crossed out numbers correspond to the lengths of the beams that were lost after the corresponding laser pulse. As shown in Table 1, the procedure was remarkably successful in releasing stiction-failed cantilevers. The same data is represented graphically in FIG. 7. The cantilevers are categorized as P2 Left and P2 Middle (for array 60), and P3 Middle and P3 Right (for array 62) to describe their positions with respect to the axis of the Nd:YAG laser beam 112. Several points are noteworthy.

First, the critical laser fluence necessary to release stiction increases with the lengths of the failed cantilevers. This increase follows a linear trend for the P2 cantilever array 60. However, such a relationship was not found for the P3 set because of a lack of sufficient data points. This issue is somewhat less important as future users of this technique will have specific interface chemistries requiring different laser fluences for stiction release than those reported in this paper.

Figure 8B:
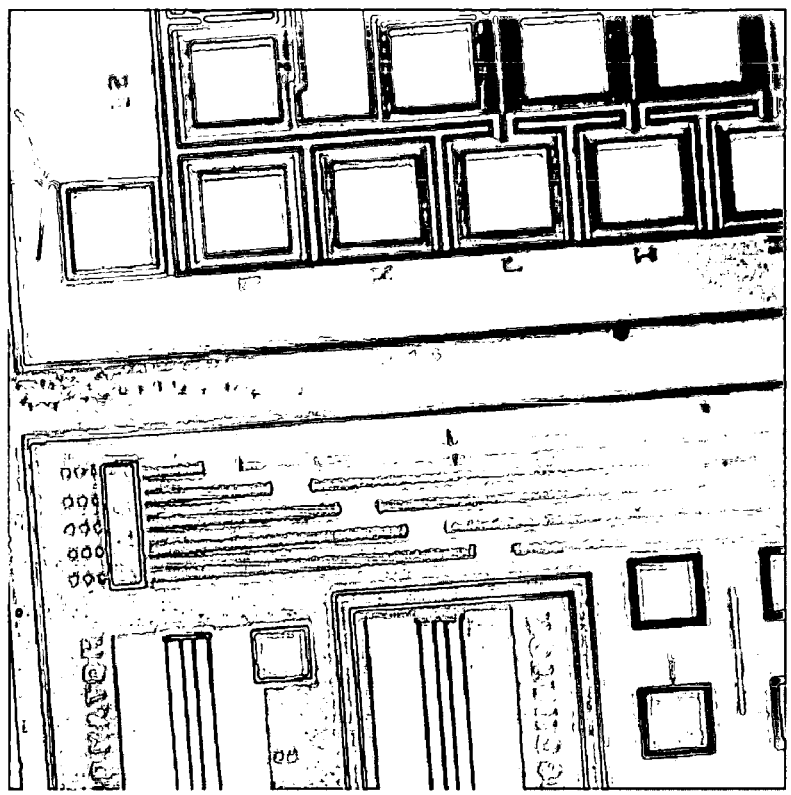
FIG. 8B is an image of the P3 array of FIG. 8A, shown after 166 mJ pulse loading.
Figure 8A:
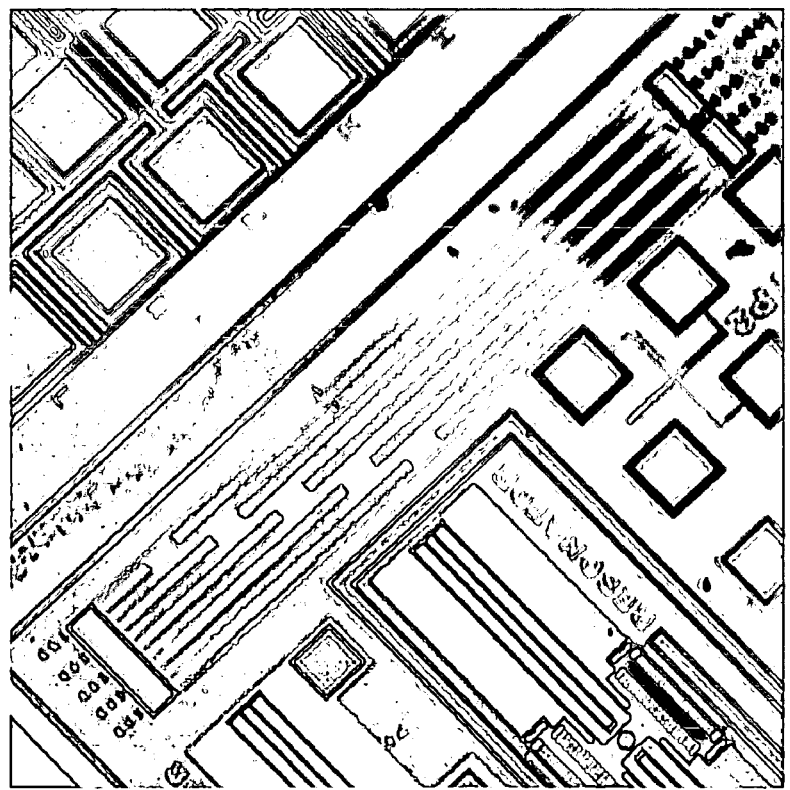
FIG. 8A is an image of the P3 array, whose stiction data is plotted in FIG. 7, shown just before release.

Throughout the testing, no visible damage to the test structures or their surrounding features was observed. This was confirmed by observing the chip under an optical microscope after each stress wave loading. FIGS. 8A and 8B demonstrate this by showing no damage to the P3 array and its surrounding features after loading from a stress wave generated by a 166 mJ laser pulse.

Figure 9:
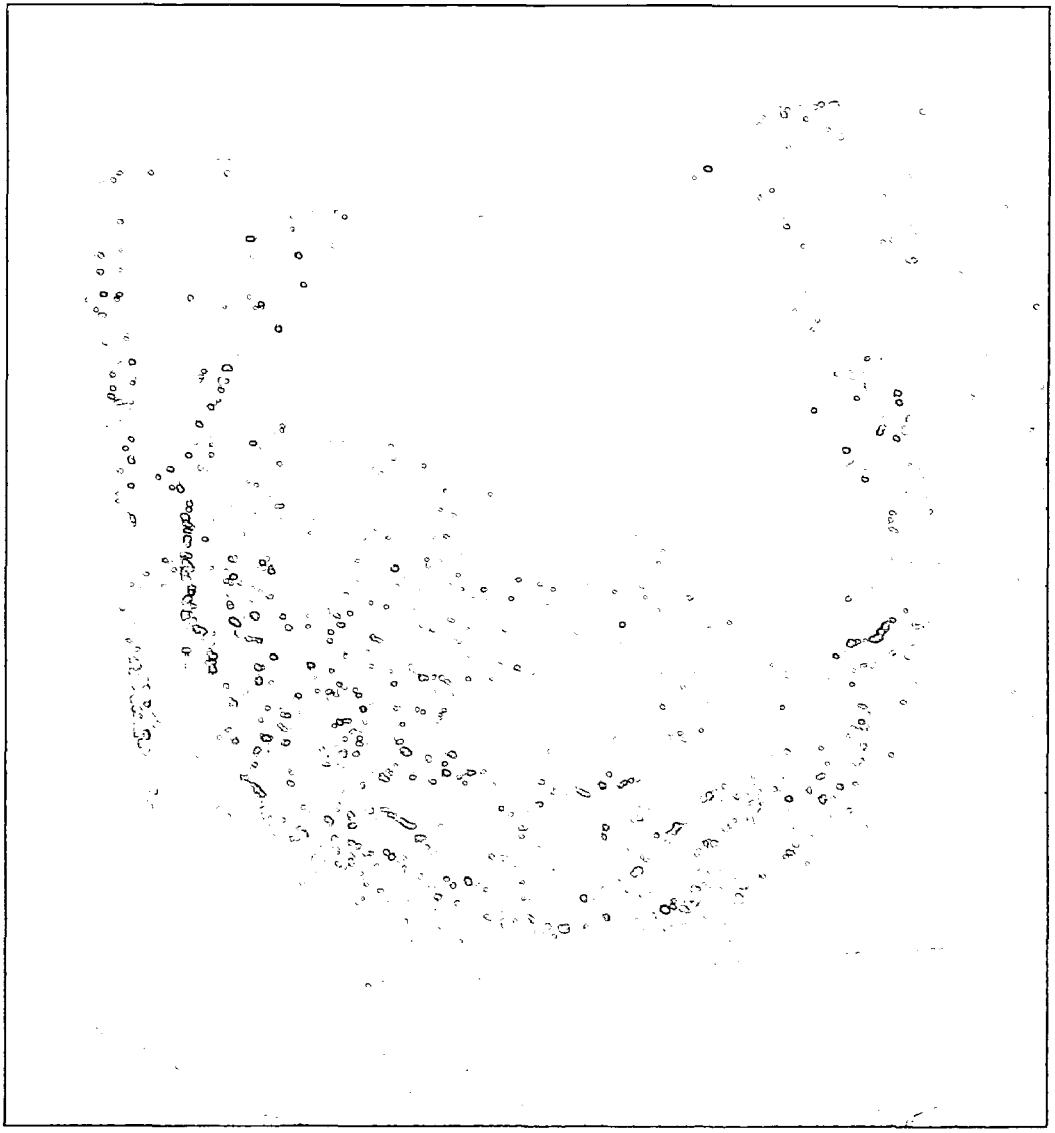
FIG. 9 is an optical micrograph of the back surface of a Si substrate after the second impingement from a 282 mJ laser pulse.

As shown in FIG. 9, minimal laser-induced surface heat scarring on the backside 72 of the Si substrate was also observed. This damage was very near the surface and did not lead to any cracks in the substrate and in no way disturbed the MEMS features on the front surface.

From a practical standpoint the data above clearly demonstrates the usefulness of the technique in repairing stiction. Because it takes only few seconds to release the cantilevers, the technique is easy to implement in any MEMS foundry, research lab setting, and can also be used to repair MEMS devices that fail due to in-use stiction.

It is of fundamental interest to understand the relationship between the laser fluence vs. the lengths of repaired beams in different sectors. Qualitatively, the variation must be related to the minor spatial variation in the stress wave amplitude arising from the Gaussian distribution of the laser energy across its 3 mm-dia area. The observed increase in the threshold laser energy to release cantilevers of increasing lengths can be explained qualitatively. The stiction-failed cantilevers trap strain energy by virtue of bending, which is higher for smaller length cantilevers for same subsurface gap or higher for higher subsurface gaps for same-length cantilevers. This trapped strain energy is however insufficient to overcome the fundamental interfacial energy necessary to release stiction. The additional strain energy provided by the stress wave loading of the present invention is sufficient to overcome the stiction. This is evidenced by the data in FIG. 7, which shows that the P3 array with a higher subsurface gap than P2 array, requires lower laser threshold energy and hence a lower stress wave amplitude to release stiction. Additionally, for the same subsurface gaps, such as cantilevers within the P2 and P3 arrays, the required laser energy increases with the lengths of the cantilevers.

In addition to above, the longer cantilevers have a larger contact area with the substrate, and thus have a higher total interfacial energy compared with their shorter counterparts. Consequently, the longer cantilever beams should require higher stress wave energy for their release, which is consistent with the experimental observations.

In conclusion, novel methods and apparatus are described to repair stiction of long-aspect ratio cantilever structures by a laser-generated stress wave to decohere the interfaces of were effectively demonstrated on a MEMS chip with stiction-failed cantilevers having lengths increasing from 100 μm to 1000 μm. The threshold laser energy to release stiction was found to increase with the cantilever lengths. Beam recovery began at a laser fluence of 11 kJ/m² laser energy, while 70% of the tested beams had been recovered after impingement with a fluence of 26 kJ/m². After the highest applied laser fluence of 40 kJ/m², 90% of the tested beams had been recovered. The method of the present invention works within a few seconds, and it does not damage the test structures or their surroundings. Thus, the technique can be easily implemented in a MEMS foundry. As these long, free-standing structures are often desirable in MEMS devices, effective and consistent processing techniques that do not lead to stiction failures are highly beneficial.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

TABLE 1

| Laser Energy (mJ) | Laser Fluence (kJ/m²) | Longest P2 Cantilever Beam Length without Stiction (μm) | | Longest P3 Cantilever Beam Length without Stiction (μm) | |
| --- | --- | --- | --- | --- | --- |
| | | Left | Middle | Middle | Right |
| Release | | | | | |
| 52 | 7.36 | | | | 300 |
| 77 | 10.89 | | | 100 | 400 |
| 96 | 13.58 | | | | |
| 116 | 16.41 | | | 600 | 500 |

TABLE 1-continued

| Laser Energy (mJ) | Laser Fluence (kJ/m²) | Longest P2 Cantilever Beam Length without Stiction (μm) | | Longest P3 Cantilever Beam Length without Stiction (μm) | |
|---|---|---|---|---|---|
| | | Left | Middle | Middle | Right |
| 127 | 17.97 | | | | 700, 800, 900 |
| 143 | 20.23 | | 200, 300 | | |
| 166 | 23.48 | | 400 | | |
| 183 | 25.89 | | 500 | | |
| 209 | 29.57 | | | | |
| 229 | 32.40 | 600 | | | |
| 248 | 35.08 | | | | |
| 269 | 38.06 | | | | |
| 282 | 39.89 | | | 1000 | |
| 282 (*) | 39.89 | 700, 800 | | | |

What is claimed is:

1. A method for releasing stiction in a suspended microstructure, the suspended microstructure being located on a first surface of a substrate, comprising:
   directing a laser pulse at a second surface of the substrate; and
   generating a stress wave in the substrate as a result of the laser pulse;
   said laser pulse configured with a sufficient fluence to propagate a compressive stress wave through said substrate without necessitating heating of the suspended microstructure;
   wherein the stress wave is directed to propagate from the second surface to the first surface of the substrate to release stiction between the suspended microstructure and the substrate, between which liquid was previously removed.

2. A method as recited in claim 1, wherein the suspended microstructure comprises a first cantilevered structure.

3. A method as recited in claim 1, wherein the suspended microstructure is at least a portion of a MEMS structure.

4. A method as recited in claim 2:
   wherein the first surface comprises a front surface of the substrate; and
   wherein at least a portion of said first cantilevered structure is adhered to the front surface of the substrate.

5. A method as recited in claim 4:
   wherein directing a laser pulse at the second surface comprises directing a laser pulse at a back surface of the substrate; and
   wherein the stress wave propagates from the back surface to the front surface of the substrate to separate the adhered portion of the cantilevered structure from the substrate.

6. A method as recited in claim 5, wherein a portion of the stress wave is transmitted into the cantilevered structure to generate a tensile stress to separate the cantilevered structure from the substrate.

7. A method as recited in claim 2, further comprising:
   a second cantilevered structure laterally spaced apart from the first cantilevered structure;
   wherein at least a portion of the first cantilevered structure is adhered to the second cantilevered structure; and
   wherein the adhered portion of the first cantilevered structure is separated from the second cantilevered structure as a result of the stress wave.

8. A method as recited in claim 5, further comprising:
   a second cantilevered structure laterally spaced apart from the first cantilevered structure;
   wherein a portion of the second cantilevered surface is adhered to the front surface of the substrate.

9. A method as recited in claim 8, wherein directing a laser pulse at a back surface of the substrate comprises focusing the laser pulse at a region of the substrate substantially coincident with the first cantilevered surface to separate the adhered portion of the first cantilevered surface from the substrate.

10. A method as recited in claim 9, further comprising:
    directing a reference laser beam at the front surface of the substrate;
    wherein the reference laser beam is configured to align the laser pulse with the first cantilevered surface.

11. A method as recited in claim 8, wherein directing a laser pulse at a back surface of the substrate comprises focusing the laser pulse at a region of the substrate and of sufficient fluence to separate the adhered portions of the both the first cantilevered structure and the second cantilevered structure from the substrate.

12. A method as recited in claim 2, wherein the cantilevered structure ranges from 100 μm to 1000 μm in length.

13. A method as recited in claim 1, wherein directing a laser pulse comprises a directing a ND:YAG laser pulse.

14. A method as recited in claim 1, wherein directing a laser pulse of sufficient fluence comprises directing a laser pulse at a laser fluence ranging from 10 kJ/m² to 40 kJ/m².

15. A method as recited in claim 14, further comprising adjusting the laser fluence according to the size of the suspended microstructure.

16. A method for releasing stiction in a suspended microstructure, the suspended microstructure being located on a first surface of a substrate, comprising:
    directing a laser pulse at a second surface of the substrate; and
    generating a stress wave in the substrate as a result of the laser pulse;
    wherein the stress wave is directed to propagate from the second surface to the first surface of the substrate to release stiction of the suspended microstructure; and
    wherein the suspended microstructure comprises:
       a first cantilevered structure; and
       a second cantilevered structure laterally spaced apart from the first cantilevered structure;
    wherein at least a portion of the first cantilevered structure is adhered to the second cantilevered structure; and
    wherein the adhered portion of the first cantilevered structure is separated from the second cantilevered structure as a result of the stress wave.

17. A method as recited in claim 16, wherein the suspended microstructure is at least a portion of a MEMS structure.

18. A method as recited in claim 16:
    wherein the first surface comprises a front surface of the substrate; and
    wherein at least a portion of said first cantilevered structure is adhered to the front surface of the substrate.

19. A method as recited in claim 18:
    wherein directing a laser pulse at the second surface comprises directing a laser pulse at a back surface of the substrate; and
    wherein the stress wave propagates from the back surface to the front surface of the substrate to separate the adhered portion of the cantilevered structure from the substrate.

20. A method as recited in claim 19, wherein a portion of the stress wave is transmitted into the cantilevered structure to generate a tensile stress to separate the cantilevered structure from the substrate.

21. A method for releasing stiction in a suspended microstructure, the suspended microstructure being located on a first surface of a substrate, comprising:
   directing a laser pulse at a second surface of the substrate;
   generating a stress wave in the substrate as a result of the laser pulse;
   wherein the stress wave is directed to propagate from the second surface to the first surface of the substrate to release stiction of the suspended microstructure.
   wherein the suspended microstructure comprises:
      a first cantilevered structure; and
      a second cantilevered structure laterally spaced apart from the first cantilevered structure;
   wherein a portion of the second cantilevered surface is adhered to the front surface of the substrate;
   wherein the first surface comprises a front surface of the substrate;
   wherein at least a portion of said first cantilevered structure is adhered to the front surface of the substrate;
   wherein directing a laser pulse at the second surface comprises directing a laser pulse at a back surface of the substrate;
   wherein the stress wave propagates from the back surface to the front surface of the substrate to separate the adhered portion of the cantilevered structure from the substrate;
   wherein directing a laser pulse at a back surface of the substrate comprises focusing the laser pulse at a region of the substrate substantially coincident with the first cantilevered surface to separate the adhered portion of the first cantilevered surface from the substrate; and
   directing a reference laser beam at the front surface of the substrate;
   wherein the reference laser beam is configured to align the laser pulse with the first cantilevered surface.

22. A method as recited in claim 21, wherein the suspended microstructure is at least a portion of a MEMS structure.

23. A method as recited in claim 21, wherein a portion of the stress wave is transmitted into the cantilevered structure to generate a tensile stress to separate the cantilevered structure from the substrate.

24. A method as recited in claim 21, further comprising:
   a second cantilevered structure laterally spaced apart from the first cantilevered structure;
   wherein at least a portion of the first cantilevered structure is adhered to the second cantilevered structure; and
   wherein the adhered portion of the first cantilevered structure is separated from the second cantilevered structure as a result of the stress wave.

25. A method as recited in claim 21, wherein directing a laser pulse at a back surface of the substrate comprises focusing the laser pulse at a region of the substrate and of sufficient fluence to separate the adhered portions of the both the first cantilevered structure and the second cantilevered structure from the substrate.

26. A method as recited in claim 21, wherein the cantilevered structure ranges from 100 μm to 1000 μm in length.

27. A method as recited in claim 21, wherein directing a laser pulse comprises a directing a ND:YAG laser pulse.

28. A method as recited in claim 21, wherein directing a laser pulse of sufficient fluence comprises directing a laser pulse at a laser fluence ranging from 10 $J/m^2$ to 40 $J/m^2$.

29. A method as recited in claim 28, further comprising adjusting the laser fluence according to the size of the suspended microstructure.

* * * * *